United States Patent
Peng et al.

(10) Patent No.: US 6,844,724 B1
(45) Date of Patent: Jan. 18, 2005

(54) COMPENSATION TECHNIQUE FOR MEASUREMENT OF MAGNETIC MOMENT AND ANISOTROPY FIELD OF PERPENDICULAR RECORDING MEDIA WITH SOFT UNDERLAYER

(75) Inventors: Qingzhi Peng, San Jose, CA (US); Hans Jürgen Richter, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 101 days.

(21) Appl. No.: 10/342,397

(22) Filed: Jan. 15, 2003

Related U.S. Application Data
(60) Provisional application No. 60/415,279, filed on Sep. 30, 2002.

(51) Int. Cl.[7] .......................... G01R 33/12; G01B 5/02
(52) U.S. Cl. ........................................ 324/212; 360/25
(58) Field of Search ................ 324/210–212; 360/25, 31; 365/53.41

(56) References Cited

U.S. PATENT DOCUMENTS

| | | |
|---|---|---|
| 4,843,316 A | 6/1989 | Hesterman |
| 5,274,327 A | 12/1993 | Smith et al. |
| 6,147,488 A * | 11/2000 | Bamba et al. ............... 324/210 |
| 6,407,575 B1 * | 6/2002 | Wissell et al. ................ 326/30 |
| 6,747,823 B2 * | 6/2004 | Saito et al. .................... 360/17 |

OTHER PUBLICATIONS

Templeton et al., Angular Dependence of Magnetization in Recording Media, IEEE Transactions on Magnetics, vol. 30, No. 6, Nov. 1994, pp. 4263–4265.*
G. Ju, et al., A New Method of Measuring Perpendicular Media Anisotropy with Correct Demagnetization Correction, digest of paper FA–09 presented at the 47 MMM (2002) Conference., p. 277.

* cited by examiner

Primary Examiner—Jay Patidar
Assistant Examiner—Reena Aurora
(74) Attorney, Agent, or Firm—McDermott Will & Emery LLP

(57) ABSTRACT

A method of measuring the magnetic moment ($M_r t$) and anisotropy field strength ($H_k$) of a perpendicular magnetic recording medium comprising a planar-surfaced perpendicular recording layer and a magnetically soft underlayer (SUL) is provided. A compensated magnetic moment $(M_r t)_{comp}$ of the recording layer is determined for a given strength (H) of a generally in-plane magnetic field applied generally to the recording layer. The compensated magnetic moment $(M_r t)_{comp}$ of the recording layer is determined for a plurality of different in-plane applied magnetic field (H) strengths to determine the variation of the compensated magnetic moment $(M_r t)_{comp}$ of the recording layer as a function of the strength (H) of the generally in-plane applied magnetic fields. The remanent magnetic moment $(M_r t(0))$ at zero (0) field strength (H) and the anisotropy field strength ($H_k$) is determined from the measured variation of the compensated magnetic moment $(M_r t)_{comp}$ of the recording layer as a function of the strength (H) of the generally in-plane applied magnetic fields.

8 Claims, 4 Drawing Sheets

COMPENSATION TECHNIQUE FOR MEASUREMENT OF MAGNETIC MOMENT AND ANISOTROPY FIELD OF PERPENDICULAR RECORDING MEDIA WITH SOFT UNDERLAYER

CROSS-REFERENCE TO PROVISIONAL APPLICATION

This application claims priority from U.S. provisional patent application Ser. No. 60/415,279 filed Sep. 30, 2002, the entire disclosure of which is incorporated herein by reference.

FIELD OF THE INVENTION

The present invention relates to an improved method for measuring magnetic moments ($M_r t$) and anisotropy field strength ($H_k$) of magnetic recording media. The invention enjoys particular utility in the measurement of $M_r t$ and $H_k$ of perpendicular magnetic recording media, e.g., hard disks, comprising a magnetically soft underlayer ("SUL").

BACKGROUND OF THE INVENTION

Magnetic media are widely used in various applications, particularly in the computer industry, and efforts are continually made with the aim of increasing the areal recording density, i.e., bit density of the magnetic media. In this regard, so-called "perpendicular" recording media have been found to be superior to the more conventional "longitudinal" media in achieving very high bit densities. In perpendicular magnetic recording media, residual magnetization is formed in a direction perpendicular to the surface of the magnetic medium, typically a layer of a magnetic material on a suitable substrate. Very high linear recording densities are obtainable by utilizing a "single-pole" magnetic transducer or "head" with such perpendicular magnetic media.

It is well-known that efficient, high bit density recording utilizing a perpendicular magnetic medium requires interposition of a relatively thick (i.e., as compared to the magnetic recording layer), magnetically "soft" underlayer ("SUL"), i.e., a magnetic layer having relatively low coercivity, such as of a NiFe alloy (Permalloy), between the non-magnetic substrate, e.g., of glass, aluminum (Al) or an Al-based alloy, and the "hard" magnetic recording layer, e.g., of a cobalt-based alloy (e.g., a Co—Cr alloy) having perpendicular anisotropy or of a (CoX/Pd or Pt)$_n$ multi-layer superlattice structure. The magnetically soft underlayer serves to guide magnetic flux emanating from the head through the magnetically hard, perpendicular magnetic recording layer. In addition, the magnetically soft underlayer reduces susceptibility of the medium to thermally-activated magnetization reversal by reducing the demagnetizing fields which lower the energy barrier that maintains the current state of magnetization.

A typical perpendicular recording system 10 utilizing a vertically oriented magnetic medium 1 with a relatively thick soft magnetic underlayer, a relatively thin hard magnetic recording layer, and a single-pole head, is illustrated in FIG. 1, wherein reference numerals 2, 3, 4, and 5, respectively, indicate the substrate, soft magnetic underlayer, at least one non-magnetic interlayer, and vertically oriented, hard magnetic recording layer of perpendicular magnetic medium 1, and reference numerals 7 and 8, respectively, indicate the single and auxiliary poles of single-pole magnetic transducer head 6. Relatively thin interlayer 4 (also referred to as an "intermediate" layer), comprised of one or more layers of non-magnetic materials, illustratively a pair of layers $4_A$ and $4_B$, is provided in a thickness sufficient to prevent (i.e. de-couple) magnetic interaction between the soft underlayer 3 and the hard recording layer 5 but should be as thin as possible in order to minimize the spacing HSS between the lower edge of the transducer head 6 and the upper edge of the magnetically soft underlayer 3. Spacing HMS between the lower edge of the transducer head 6 and the upper edge of the hard magnetic recording layer 5 is also minimized during operation of system 10. In addition to the above, interlayer 4 also serves to promote desired microstructural and magnetic properties of the hard recording layer 5.

As shown by the arrows in the figure indicating the path of the magnetic flux ϕ, flux ϕ is seen as emanating from single pole 7 of single-pole magnetic transducer head 6, entering and passing through vertically oriented, hard magnetic recording layer 5 in the region above single pole 7, entering and travelling along soft magnetic underlayer 3 for a distance, and then exiting therefrom and passing through vertically oriented, hard magnetic recording layer 5 in the region above auxiliary pole 8 of single-pole magnetic transducer head 6. The direction of movement of perpendicular magnetic medium 1 past transducer head 6 is indicated in the figure by the arrow above medium 1.

With continued reference to FIG. 1, vertical lines 9 indicate grain boundaries of each polycrystalline (i.e., granular) layer of the layer stack constituting medium 1. As apparent from the figure, the width of the grains (as measured in a horizontal direction) of each of the polycrystalline layers constituting the layer stack of the medium is substantially the same, i.e., each overlying layer replicates the grain width of the underlying layer. Completing medium 1 are a protective overcoat layer 11, such as a layer of diamond-like carbon (DLC) formed over hard magnetic layer 5, and a lubricant topcoat layer 12, such as a layer of a perfluoropolyethylene material, formed over the protective overcoat layer 11. Substrate 2 is typically disk-shaped and comprised of a non-magnetic metal or alloy, e.g., Al or an Al-based alloy, such as Al—Mg having an Ni—P plating layer on the deposition surface thereof, or substrate 2 is comprised of a suitable glass, ceramic, glass-ceramic, polymeric material, or a composite or laminate of these materials and may include an adhesion layer $2_A$ at the upper surface thereof, typically comprised of an about 10 to about 50 Å thick layer of Cr; soft magnetic underlayer 3 is typically comprised of an about 1,000 to about 4,000 Å thick layer of a soft magnetic material selected from the group consisting of Ni, NiFe (Permalloy), Co, CoFe, Fe, FeN, FeSiAl, FeSiAlN, etc.; the at least one interlayer 4 typically comprises a layer or a pair of up to about 10 Å thick layers $4_A$, $4_B$, of at least one non-magnetic material, such as Pt, Pd, Ta, Ru, Ti, Ti—Cr, and Co-based alloys; and hard magnetic layer 5 is typically comprised of an about 60 to about 300 Å thick layer of a Co-based alloy including one or more elements selected from the group consisting of Cr, Fe, Ta, Ni, Mo, Pt, V, Nb, Ge, and B, iron oxides, such as $Fe_3O_4$ and $\delta\text{-}Fe_2O_3$, or a (CoX/Pd or Pt)$_n$ multilayer magnetic superlattice structure, where n is an integer from about 10 to about 25, each of the alternating, thin layers of Co-based magnetic alloy is from about 2 to about 3.5 Å thick, X is an element selected from the group consisting of Cr, Ta, B, Mo, and Pt, and each of the alternating thin, non-magnetic layers of Pd or Pt is about 10 Å thick. Each type of hard magnetic recording layer material has perpendicular anisotropy arising from magneto-crystalline anisotropy (1$^{st}$ type) and/or interfacial anisotropy (2$^{nd}$ type).

Currently, no existing technique based upon utilization of a conventionally employed Vibrating Sample Magnetometer ("VSM") is available for accurately measuring the magnetic remanence-thickness product ($M_r t$), hereinafter "sample perpendicular magnetic moment", and magnetic anisotropy field strength ($H_k$), of such perpendicular recording media comprising a magnetically soft underlayer (SUL), due to the overwhelming contribution from the SUL to the VSM signal. As a consequence, an optical method relying upon measurement of the Kerr effect and termed "SMOKE", is frequently employed as an alternative method for measuring M-H loops of SUL-containing perpendicular media, which SMOKE method is incapable of providing absolute measurements of $M_r t$.

In view of the above, there exists a clear need for improved methodology for measuring absolute values of the magnetic moment $M_r t$, as well as anisotropy field $H_k$, of SUL-containing perpendicular magnetic recording media. In addition, there exists a need for improved methodology for rapidly, accurately, and cost-effectively performing measurements of absolute $M_r t$ anf $H_k$ values of SUL-containing, high areal recording density perpendicular magnetic recording media, e.g., hard disks.

The present invention addresses and solves problems attendant upon the measurement of absolute $M_r t$ and $H_k$ values of SUL-containing high areal recording density perpendicular magnetic recording media, while maintaining full compatibility with all structural and mechanical aspects of high bit recording density technology. Moreover, the methodology according to the present invention can be practiced by means of conventional apparatus and instrumentalities.

DISCLOSURE OF THE INVENTION

An advantage of the present invention is an improved method of measuring the magnetic moment ($M_r t$) and anisotropy field strength ($H_k$) of a perpendicular magnetic recording medium comprising a magnetically soft underlayer (SUL).

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by a method of measuring magnetic moments ($M_r t$) and anisotropy field strength ($H_k$) of a perpendicular magnetic recording medium comprising a magnetically soft underlayer (SUL), comprising sequential steps of:

(a) providing a perpendicular magnetic recording medium comprising a magnetically soft underlayer (SUL) and a planar-surfaced perpendicular magnetic recording layer;

(b) determining a compensated magnetic moment $(M_r t)_{comp}$ of the recording layer for a given strength (H) of generally in-plane magnetic fields applied generally parallel to the planar surface of the recording layer;

(c) repeating step (b) for a plurality of different strengths of the generally in-plane applied magnetic fields (H) for determining the variation of the compensated magnetic moments $(M_r t)_{comp}$ of the recording layer as a function of the strengths (H) of the generally in-plane applied magnetic fields; and (d) determining the remanent magnetic moment ($M_r t(0)$) at zero (0) field strength (H) and the anisotropy field strength ($H_k$) from the measured variation of the compensated magnetic moments $(M_r t)_{comp}$ of the recording layer as a function of the strength (H) of the generally in-plane applied magnetic fields.

According to embodiments of the present invention, step (b) comprises steps of:

($b_1$) applying a magnetic field perpendicular to the planar surface of the recording layer, the applied perpendicular magnetic field being of strength sufficient to magnetically saturate the recording medium;

($b_2$) rotating the direction of the applied magnetic field approximately +90° from that of the applied perpendicular magnetic field and applying a positive (+) in-plane magnetic field (+H) of given strength generally parallel to the plane of the recording layer;

($b_3$) measuring a perpendicular positive (+) component $(M_r t)_+$ of the magnetic moment for the given in-plane magnetic field strength (+H);

($b_4$) rotating the direction of the magnetic field approximately −90° from that of the applied perpendicular magnetic field and applying a negative (−) in-plane magnetic field (−H) of the given strength generally parallel to the plane of the recording layer;

($b_5$) measuring a perpendicular negative (−) component $(M_r t)_-$ of the magnetic moment for the given in-plane magnetic field strength (−H); and ($b_6$) determining a compensated value $(M_r t)_{comp}$ of the magnetic moment ($M_r t$) as the average value of the measured values of $(M_r t)_+$ and $(M_r t)_-$; wherein:

step (c) comprises repeating steps ($b_1$)–($b_6$) for a plurality of given in-plane magnetic field strengths (H).

In accordance with embodiments of the present invention, step (c) comprises graphically plotting the variation of $((M_r t)_{comp})^2$ as a function of $(H)^2$; and step (d) further comprises determining the value of the remanent magnetic moment ($M_r t(0)$) at zero (0) field strength (H) by extrapolating the graphical plot of the variation of $((M_r t)_{comp})^2$ as a function of $(H)^2$ to $(H)^2=0$, wherein step (d) still further comprises determining the value of the anisotropy field strength ($H_k$) from the relation $H_k = 1/C + 4\pi M_s$, where C is a constant and $M_s$ is the saturation magnetization of the recording layer.

Particular embodiments of the invention include those wherein:

steps ($b_3$) and ($b_5$) each comprise utilizing a vector VSM for performing the measuring; and step (a) comprises providing a perpendicular magnetic recording medium comprising a non-magnetic substrate having a surface with a layer stack formed thereon, the layer stack comprising, in overlying sequence from the substrate surface:

($a_1$) a soft magnetic underlayer (SUL) of a relatively low coercivity magnetic material; and ($a_2$) a perpendicularly anisotropic, hard recording layer of a relatively high coercivity magnetic material.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention addresses and solves problems attendant upon the measurement of absolute $M_r t$ and $H_k$ values of SUL-containing high areal recording density perpendicular magnetic recording media, while maintaining full compatibility with all structural and mechanical aspects of high bit recording density technology. More specifically, the present invention addresses the problem in measuring absolute $M_r t$ and $H_k$ values of high areal recording density perpendicular magnetic recording media by means of a Vibrating Sample Magnetometer (VSM) technique, which problem or difficulty stems from the overwhelming contribution to the VSM signal provided by the magnetically soft underlayer (SUL) of such perpendicular media, and is based upon the discovery by the present inventors that the difficulty in obtaining absolute values of the magnetic moment $(M_r t)$, as well as the anisotropy field $(H_k)$ of perpendicular magnetic recording media, can be overcome by means of a novel and easily performed compensation technique.

A key feature, therefore, of the present invention, is the determination of a compensated magnetic moment $(M_r t)_{comp}$ of SUL-containing, planar-surfaced perpendicular magnetic recording media as the arithmetic average of perpendicular positive (+) and negative (–) components $(M_r t)_+$ and $(M_r t)_-$ of the magnetic moment of the media, measured utilizing respective applied positive (+) and negative (–) in-plane magnetic fields (+H) and (–H), which positive and negative in-plane magnetic fields applied to the media are 180° apart in direction.

Another key feature of the present invention is the determination of the variation of the compensated magnetic moment $(M_r t)_{comp}$ with intensity of the applied positive (+) and negative (–) in-plane magnetic fields (+H) and (–H), from which the remanent magnetic moment $((M_r t(0))$ at zero (0) applied field intensity is obtained graphically, followed by determination of the anisotropy field strength $(H_k)$.

Figure 1:
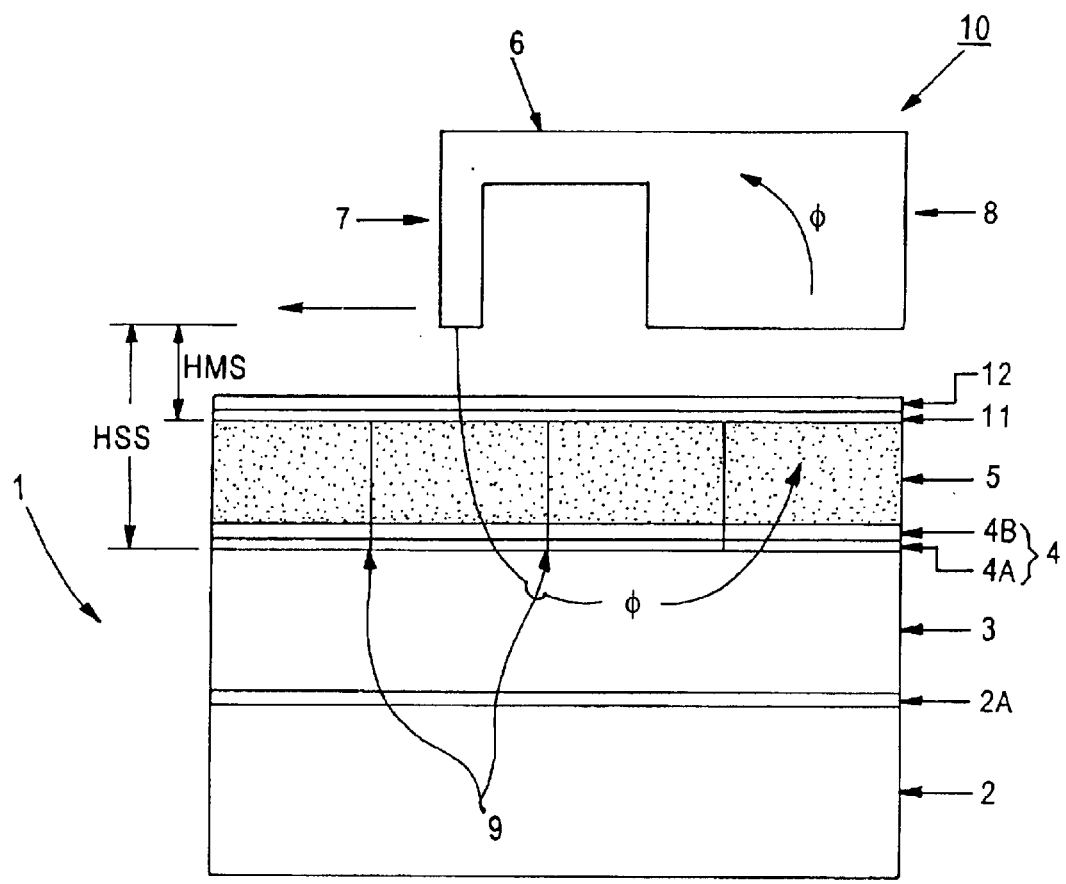
FIG. 1 schematically illustrates, in simplified cross-sectional view, a portion of a magnetic recording, storage, and retrieval system comprised of a perpendicular magnetic recording medium including a magnetically soft underlayer (SUL) and a single-pole transducer head.
Figures 2A, 2B, 2C:
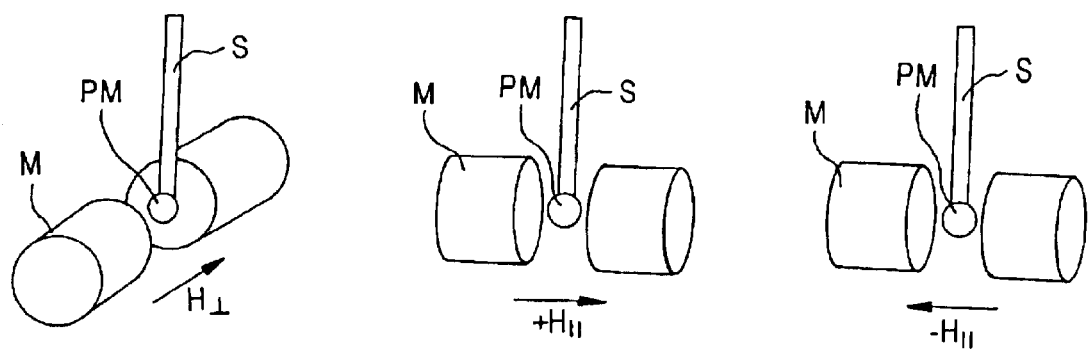
FIGS. 2(A)–2(C) schematically illustrate, in simplified perspective view, sequential stages of the compensated magnetic moment $(M_r t)_{comp}$ measuring method according to the present invention.

Referring now to FIGS. 2(A)–2(C) schematically illustrated therein, in simplified perspective view, are sequential stages of the compensated magnetic moment $(M_r t)_{comp}$ measuring method according to the present invention. More specifically, FIG. 2(A) schematically illustrates an initial stage of a vector VSM measurement according to the inventive methodology, wherein a disk-shaped perpendicular magnetic recording medium PM similar to that shown and described with reference to FIG. 1 and comprising a non-magnetic substrate having a surface with a layer stack formed thereon, a soft magnetic underlayer (SUL) of a relatively low coercivity magnetic material, and an overlying perpendicularly anisotropic, magnetically hard recording layer of a relatively high coercivity magnetic material, is suspended, via suspending means S, in the inter-polar space of electromagnet M, and the medium PM is magnetically saturated by applying a large magnetic field $(H_\perp)$ perpendicular to the planar surface of the medium.

Adverting to FIG. 2(B), in the next stage according to the invention, suspending means S is rotated approximately 90° along its vertical axis so that the planar surface thereof is aligned substantially parallel to the direction of the magnetic field H between the electromagnet poles. A first, or positive (+) direction magnetic field $(+H_\parallel)$ of a given strength is then applied generally parallel to the planar surface of the medium PM and a positive (+) perpendicular component $(M_r t)_+$ of the magnetic moment (i.e., perpendicular to the applied magnetic field $(+H_\parallel)$ and the planar surface of the medium) then measured using a conventional vector VSM technique.

Referring to FIG. 2(C), in the third (final) stage according to the invention, a second, negative (–) direction magnetic field $(-H_\parallel)$ reverse that of the first positive (+) direction magnetic field and of the same strength is then applied generally parallel to the planar surface of the medium PM and a negative (–) perpendicular component $(M_r t)_-$ of the magnetic moment then measured using the same conventional vector VSM technique.

According to the invention, a compensated (absolute) magnetic moment $(M_r t)_{comp}$ of the perpendicular recording medium PM is then obtained as the arithmetic average of the positive and negative perpendicular components $(M_r t)_+$ and $(M_r t)_-$ of the magnetic moment, i.e., $(M_r t)_{comp} = [(M_r t)_+ + (M_r t)_-]/2$. Both $(M_r t)_+$ and $(M_r t)_-$ include contributions from the magnetic moment of the SUL of the medium; however, since the SUL contributions to $(M_r t)_+$ and $(M_r t)_-$ have opposite signs (i.e., are of opposite polarities), according to the inventive methodology, the SUL contribution to the magnetic moment $(M_r t)$ is compensated for (i.e., negated) upon averaging the $(M_r t)_+$ and $(M_r t)_-$ measurements.

Figure 3:
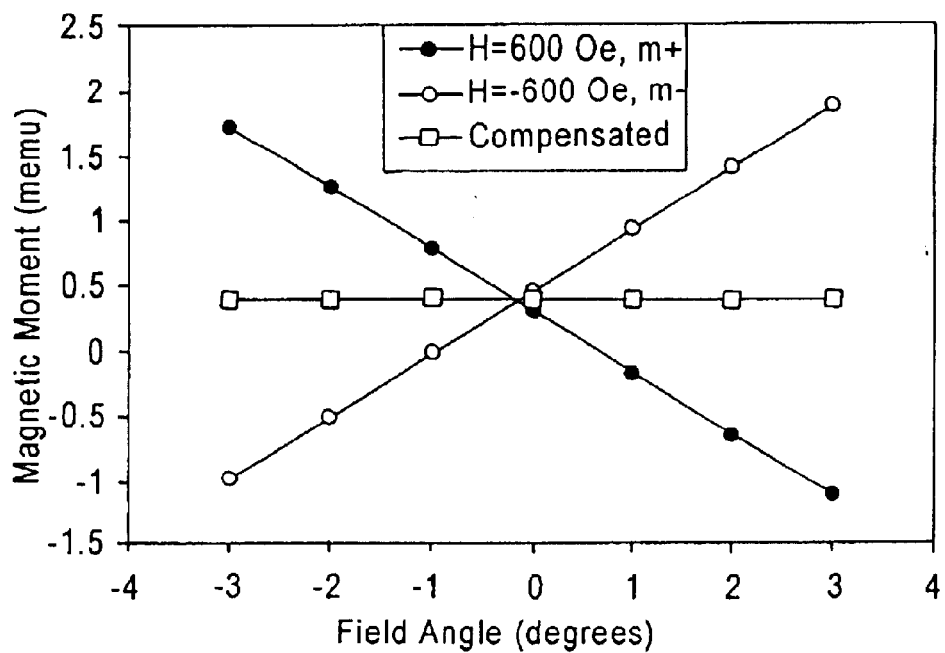
FIG. 3 is a graph for illustrating the dependence of $(M_r t)_+$ and $(M_r t)_-$ on angle of the applied in-plane magnetic fields (+H) and (–H) and the constancy of the compensated magnetic moment $(M_r t)_{comp}$.

Because the SUL has a very large saturation magnetization $(M_s)$, the measured values of $(M_r t)_+$ and $(M_r t)_-$ are very sensitive to deviations from 0° (i.e., the applied magnetic field is perfectly parallel to the media surface) of the angle between the applied first, or positive (+) direction magnetic field $(+H_\parallel)$ and the media surface and similar deviations from 0° of the angle between the applied second, or negative (–) direction magnetic field $(-H_\parallel)$ and the media surface. However, as is evident from the illustrative, but not limitative, example shown in FIG. 3, which is a graph for illustrating the dependence of $(M_r t)_+$ (solid circles) and $(M_r t)_-$ (open circles) on the angle of deviation of the applied in-plane 600 Oe magnetic fields (+H) and (−H) from 0°, a substantially constant value of the compensated magnetic moment $(M_r t)_{comp}$ (open squares) is obtained via the arithmetic averaging technique of the invention for the same angular deviations from 0° of the first, positive direction $(+H_\parallel)$ and second, negative direction $(-H_\parallel)$ applied magnetic fields.

According to the invention, values of $(M_r t)_{comp} = [(M_r t)_+ + (M_r t)_-]/2$, i.e., absolute values, are measured/determined for a plurality of in-plane applied magnetic field strengths $(+H_\parallel)$ and $(-H_\parallel)$, with the sample medium being re-saturated along the perpendicular direction by means of the large magnetic field $(H_\perp)$ applied perpendicular to the planar surface of the medium, in order to determine the dependence of $(M_r t)_{comp}$ on (H), i.e., $(+H_\parallel)$ and $(-H_\parallel)$. It is well known that $M_r t$ for a given field strength (H), i.e., $M_r t(H)$, is related to (H) by the following equation:

$$[M_r t(H)]^2 = [M_r t(0)]^2 [1-(CH)^2],$$

where C is a constant related to the anisotropy field $H_k$ of the perpendicular recording layer via the following equation:

$$1/C = H_k - 4\pi M_s,$$

where $M_s$ is the saturation magnetization of the perpendicular recording layer.

Figure 4:
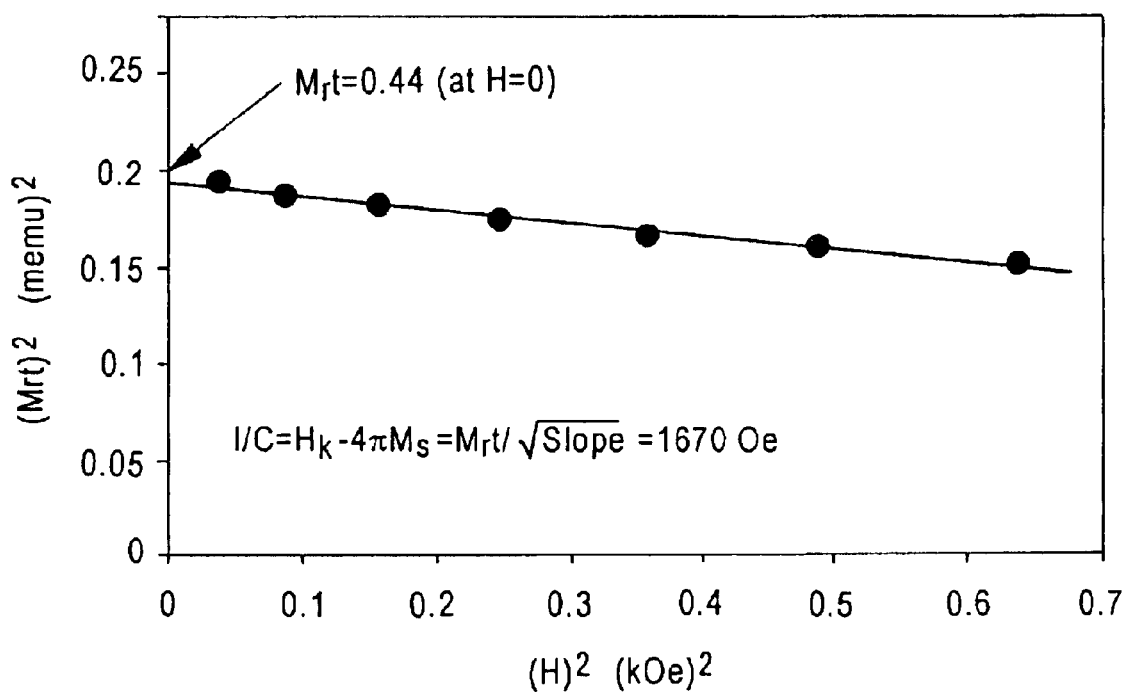
FIG. 4 is a graph for illustrating the dependence of $((M_r t)_{comp})^2$ as a function of $(H)^2$ and the determination of the remanent magnetic moment $(M_r t(0))$.

Referring to FIG. 4, shown therein is an illustrative, but not limitative, example of a graph illustrating the dependence of $((M_r t)_{comp})^2$ as a function of $(H)^2$. As shown in the figure, extrapolation of the $((M_r t)_{comp})^2$ curve to $(H)^2 = 0$ yields the square of the remanent magnetic moment $(M_r t(0))^2$, i.e., the square of the magnetic moment $M_r t$ at zero (0) applied field intensity (H), from which the remanent magnetic moment $(M_r t(0))$ is then readily calculated (e.g., as 0.44 memu in the illustrated Example of FIG. 4).

In accordance with the inventive methodology, the measured dependence of the compensated (absolute) magnetic moment $(M_r t)_{comp}$ on applied field intensity (H) is then utilized for characterizing the magnitude of the anisotropy field $(H_k)$ of the medium via the constant C, wherein C is obtained from the measured and graphically plotted data (e.g., 1/C = 1,670 Oe in the example of FIG. 4), utilizing the following relationships:

$$1/C = H_k - 4\pi M_s = M_r t/(slope)^{1/2},$$

wherein the value of the saturation magnetization $(M_s)$ of the perpendicular recording layer (with remanent squareness~1 and where $M_s = M_r$) is obtained from its remanent magnetic moment $(M_r t(0))$ and thickness t. When measuring the anisotropy field, however, practical issues such as minimization of cross-talk and residual signals must be taken into account in order to obtain maximum accuracy of measurement.

The present invention thus advantageously provides an improved method for determining heretofore unavailable absolute values of the magnetic moments $(M_r t)$, as well as anisotropy fields $(H_k)$, of perpendicular magnetic recording media comprising magnetically soft underlayers (SUL). Moreover, the inventive methodology can be readily practiced in cost-effective manner utilizing conventional Vibrating Sample Magnetometer technology and is useful in characterization of all types of perpendicular magnetic recording media comprising magnetically soft underlayers.

Figure 5:
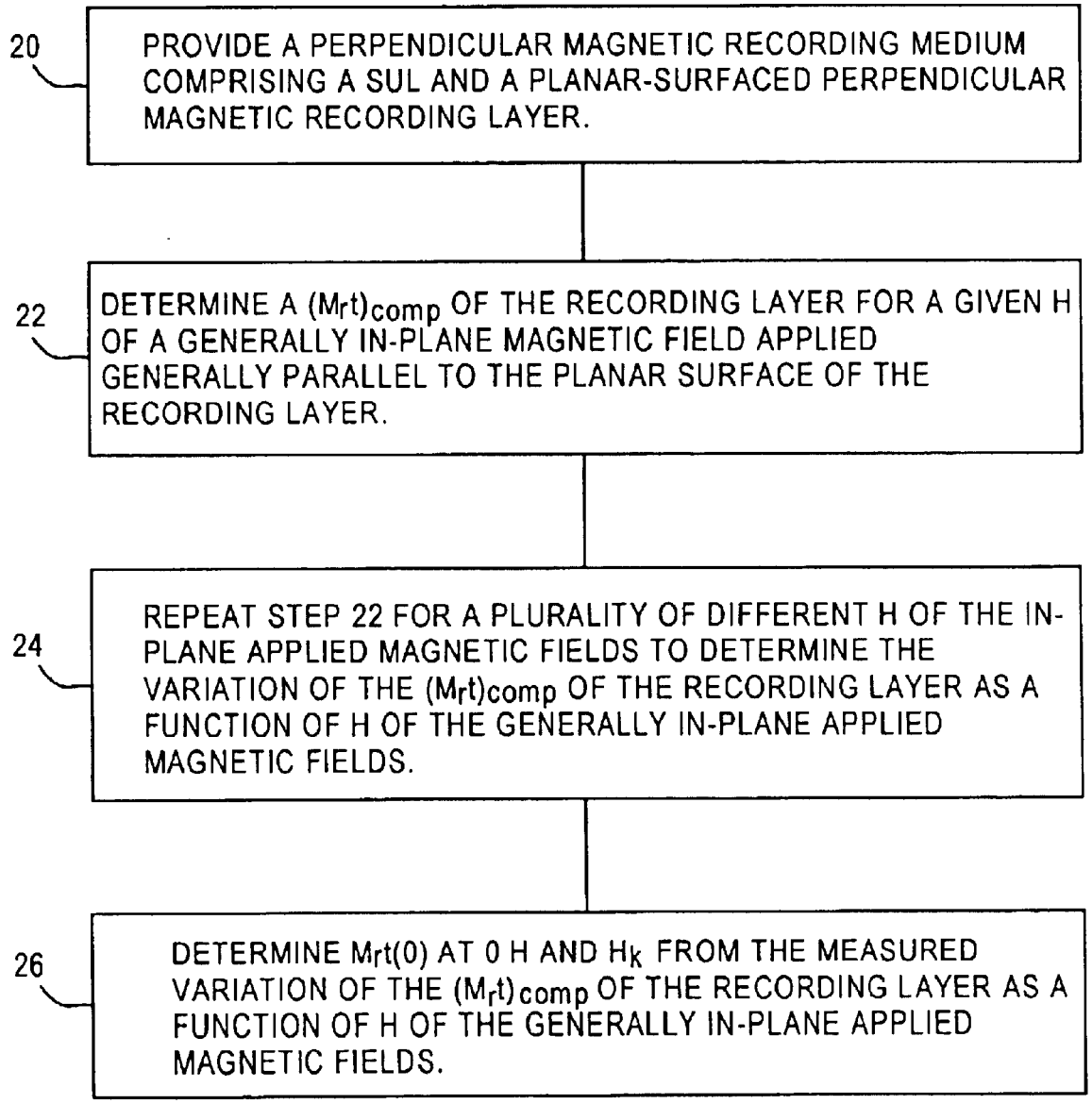
FIG. 5 is a flowchart illustrating a method of measuring the magnetic moment and anisotropy field strength of a magnetic recording medium according to an embodiment of the present invention.

FIG. 5 illustrates a method of measuring the $M_r t$ and $H_k$ of a perpendicular magnetic recording medium comprising a SUL according to a certain embodiment of the present invention. A perpendicular magnetic recording medium comprising a SUL and a planar-surfaced perpendicular magnetic recording layer is provided in step 20. A $(M_r t)_{comp}$ of the recording layer for a given H of a generally in-plane magnetic field applied generally parallel to the planar surface of the recording layer is determined in step 22. Step 22 is repeated for a plurality of different H of in-plane applied magnetic fileds to determine the variation of the $(M_r t)_{comp}$ of the recording layer as a function of H of the generally in-plane applied magnetic fields, as in step 24. $M_r t(0)$ at 0H and $H_k$ are determined in step 26 from the measured variation of $(M_r t)_{comp}$ of the recording layer as a function of H of the generally in-plane applied magnetic fields.

Figure 6:
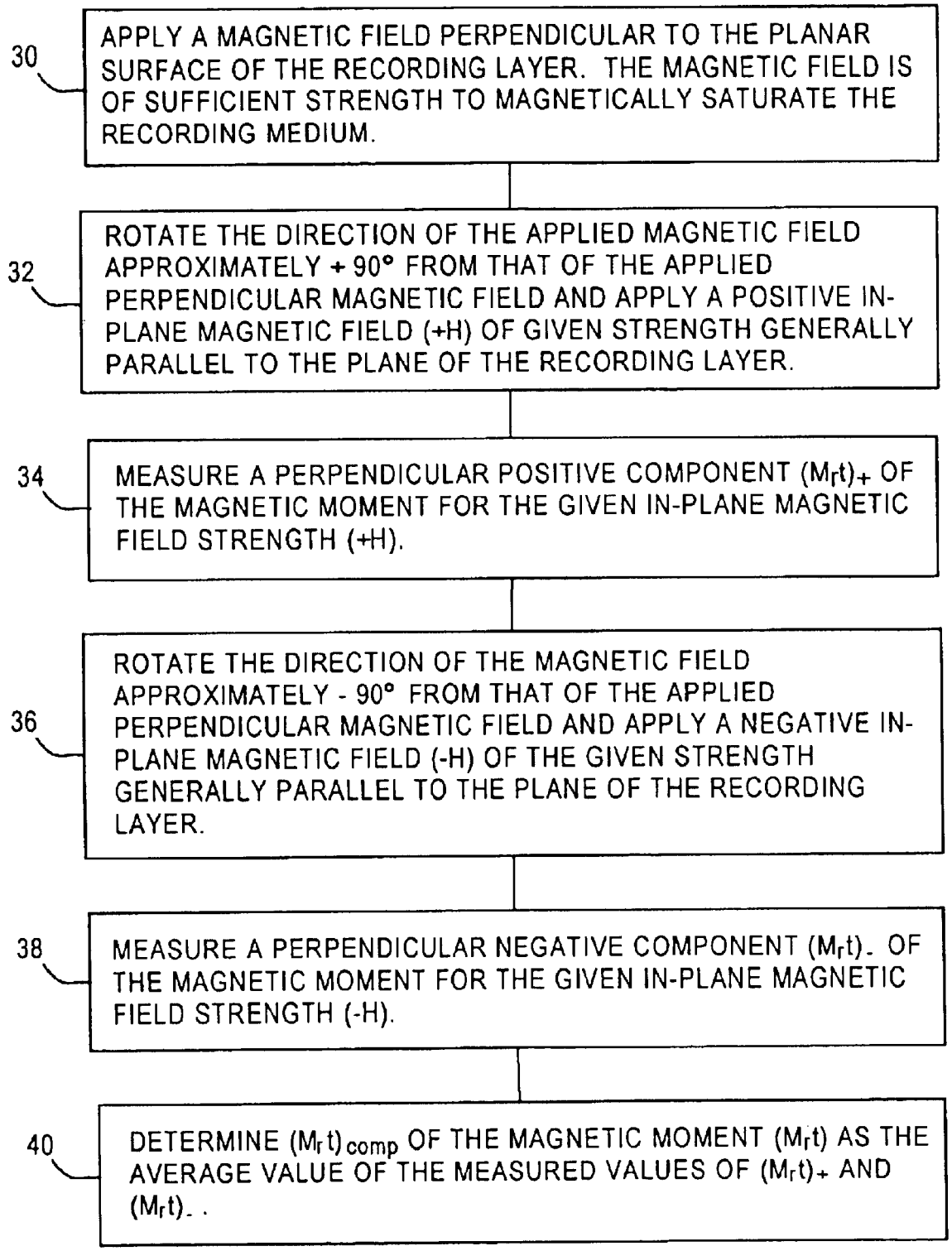
FIG. 6 is a flowchart illustrating a method of determining a compensated magnetic moment of a recording layer for a given strength of a generally in-plane magnetic field applied generally parallel to the planar surface of the recording layer according to an embodiment of the present invention.

FIG. 6 illustrates a method of determining the $(M_r t)_{comp}$ of the recording layer for a given H of a generally in-plane magnetic field applied generally parallel to the planar surface of the recording layer according to a certain embodiment of the present invention. A magnetic field is applied perpendicular to the planar surface of the recording layer in step 30. The applied perpendicular magnetic field is of sufficient strength to magnetically saturate the recording medium. The direction of the applied magnetic field is rotated approximately +90° from that of the applied perpendicular magnetic field and a positive in-plane magnetic field (+H) of given strength generally parallel to the plane of the recording layer is applied in step 32. In step 34, a perpendicular positive component $(M_r t)_+$ of the magnetic moment for the given in-plane magnetic field strength (+H) is measured. The direction of the magnetic field is rotated approximately −90° from that of the applied perpendicular magnetic field and a negative in-plane magnetic field (−H) of the given strength is applied generally parallel to the plane of the recording layer in step 36. In step 38, a perpendicular negative component $(M_r t)_-$ of the magnetic moment is measured for the given in-plane magnetic field strength (−H), and a $(M_r t)_{comp}$ of the magnetic moment $(M_r t)$ as the average value of the measured values of $(M_r t)_+$ and $(M_r t)_-$ is determined in step 40.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of measuring the magnetic moment $(M_r t)$ and anisotropy field strength $(H_k)$ of a perpendicular magnetic recording medium comprising a magnetically soft underlayer (SUL), comprising sequential steps of:

(a) providing a perpendicular magnetic recording medium comprising a magnetically soft underlayer (SUL) and a planar-surfaced perpendicular magnetic recording layer;

(b) determining a compensated magnetic moment $(M_r t)_{comp}$ of said recording layer for a given strength (H) of a generally in-plane magnetic field applied generally parallel to said planar surface of said recording layer;

(c) repeating step (b) for a plurality of different strengths of said in-plane applied magnetic fields (H) for determining the variation of the compensated magnetic moments $(M_r t)_{comp}$ of said recording layer as a function of the strengths (H) of said generally in-plane applied magnetic fields; and (d) determining the remanent magnetic moment $(M_r t(0))$ at zero (0) field strength (H) and the anisotropy field strength $(H_k)$ from the measured variation of the compensated magnetic moments $(M_r t)_{comp}$ of said recording layer as a function of the strength (H) of said generally in-plane applied magnetic fields.

2. The method according to claim 1, wherein step (b) comprises steps of:

($b_1$) applying a magnetic field perpendicular to said planar surface of said recording layer, said applied perpendicular magnetic field being of strength sufficient to magnetically saturate said recording medium;

($b_2$) rotating the direction of said applied magnetic field approximately +90° from that of said applied perpendicular magnetic field and applying a positive (+) in-plane magnetic field (+H) of given strength generally parallel to said plane of said recording layer;

($b_3$) measuring a perpendicular positive (+) component $(M_r t)_+$ of the magnetic moment for said given in-plane magnetic field strength (+H);

($b_4$) rotating the direction of said magnetic field approximately −90° from that of said applied perpendicular magnetic field and applying a negative (−) in-plane magnetic field (−H) of said given strength generally parallel to said plane of said recording layer;

($b_5$) measuring a perpendicular negative (−) component $(M_r t)_-$ of the magnetic moment for said given in-plane magnetic field strength (−H); and ($b_6$) determining a compensated value $(M_r t)_{comp}$ of said magnetic moment $(M_r t)$ as the average value of the measured values of $(M_r t)_+$ and $(M_r t)_-$.

3. The method according to claim 2, wherein:

step (c) comprises repeating steps ($b_1$)–($b_6$) for a plurality of given in-plane magnetic field strengths (H).

4. The method according to claim 3, wherein:

step (c) comprises graphically plotting the variation of $((M_r t)_{comp})^2$ as a function of $(H)^2$.

5. The method according to claim 4, wherein:

step (d) further comprises determining the value of said remanent magnetic moment $(M_r t(0))$ at zero (0) field strength (H) by extrapolating said graphical plot of the variation of $((M_r t)_{comp})^2$ as a function of $(H)^2$ to $(H)^2 = 0$.

6. The method according to claim 5, wherein:

step (d) further comprises determining the value of the anisotropy field strength $(H_k)$ from the relation $H_k = 1/C + 4\pi M_s$, where C is a constant and $M_s$ is the saturation magnetization of the recording layer.

7. The method according to claim 2, wherein:

steps ($b_3$) and ($b_5$) each comprise utilizing a vector VSM for performing said measuring.

8. The method according to claim 1, wherein step (a) comprises providing a perpendicular magnetic recording medium comprising a non-magnetic substrate having a surface with a layer stack formed thereon, said layer stack comprising, in overlying sequence from said substrate surface:

($a_1$) a soft magnetic underlayer (SUL) of a relatively low coercivity magnetic material; and ($a_2$) a perpendicularly anisotropic, hard recording layer of a relatively high coercivity magnetic material.

\* \* \* \* \*